Figure 1:
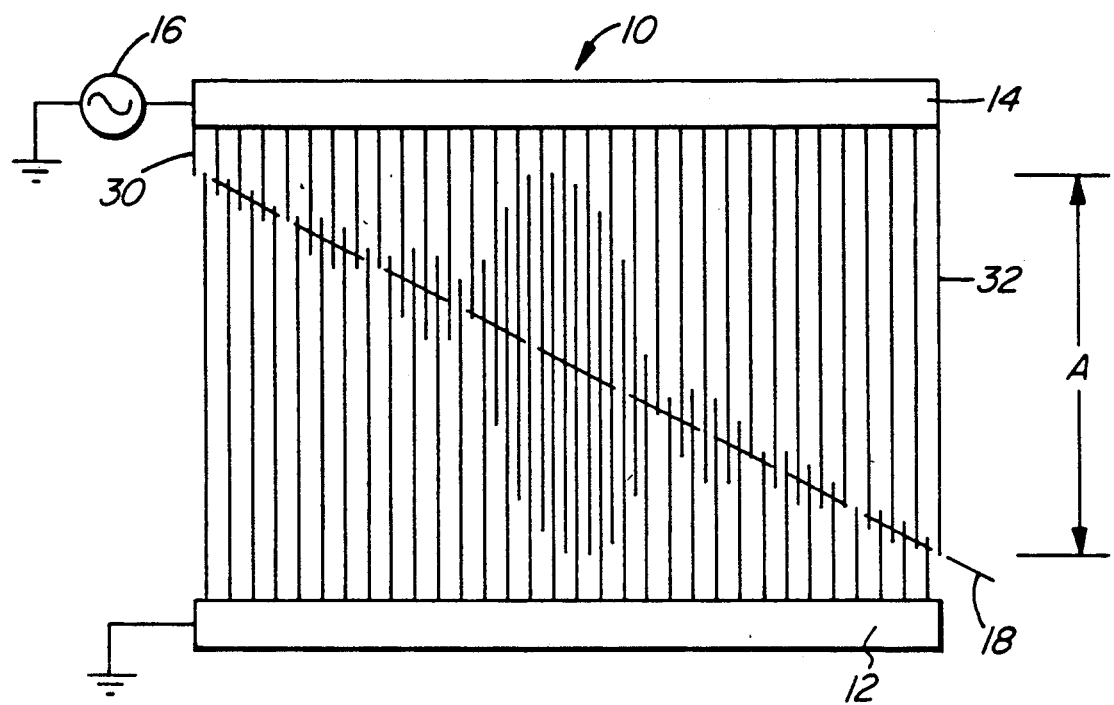

United States Patent [19]

Suthers et al.

[11] Patent Number: 5,019,742
[45] Date of Patent: May 28, 1991

[54] SAW DEVICE WITH APODIZED IDT

[75] Inventors: Mark S. Suthers, Lanark; Grantley O. Este, Stittsville; Richard W. Streater, Nepean, all of Canada

[73] Assignee: Northern Telecom Limited, Montreal, Canada

[21] Appl. No.: 102,786

[22] Filed: Sep. 23, 1987

Related U.S. Application Data

[63] Continuation of Ser. No. 839,657, Mar. 14, 1986, abandoned.

[51] Int. Cl.⁵ .............................................. H01L 41/08
[52] U.S. Cl. .................................. 310/313 C; 333/154
[58] Field of Search ........... 310/313 R, 313 B, 313 C, 310/348; 333/193–196, 150–155

[56] References Cited

U.S. PATENT DOCUMENTS

| 3,633,132 | 1/1972 | Hartemann | 310/313 C |
| 3,663,899 | 5/1972 | Dieulesaint et al. | 333/196 X |
| 3,688,223 | 8/1972 | Pratt et al. | 310/313 C |
| 3,699,364 | 10/1972 | Gerard | 310/313 C |
| 4,007,433 | 2/1977 | Houkawa et al. | 310/313 C X |
| 4,066,985 | 1/1978 | Kuny | 310/313 C X |
| 4,096,456 | 6/1978 | Coussot et al. | 310/313 C X |
| 4,354,129 | 10/1982 | Ieki | 310/313 C |

FOREIGN PATENT DOCUMENTS

| 0149812 | 11/1981 | Japan | 333/195 |
| 0138115 | 8/1983 | Japan | 333/195 |
| 0200620 | 11/1983 | Japan | 333/195 |
| 0080011 | 5/1984 | Japan | 333/195 |
| 0053314 | 3/1985 | Japan | 333/195 |

Primary Examiner—Mark O. Budd
Attorney, Agent, or Firm—R. John Haley; Dallas F. Smith

[57] ABSTRACT

A SAW (surface acoustic wave) device includes a substrate having thereon at least one apodized IDT (interdigital transducer). The axis of the apodization pattern is inclined towards a driven conductive rail of the IDT at the ends of the pattern, whereby the driven end fingers have a low capacitive coupling to a ground plane on which the substrate is supported. The capacitive coupling to the ground plane may also be reduced by supporting the substrate on the ground plane via an insulating support, whereby an air gap or the insulating support decreases the capacitance between the IDT and the ground plane.

11 Claims, 2 Drawing Sheets

SAW DEVICE WITH APODIZED IDT

This is a continuation of application Ser. No. 839,657 filed Mar. 14, 1986, now abandoned.

This invention relates to SAW (surface acoustic wave) devices, and is particularly concerned with such devices including at least one apodized IDT (inter-digital transducer).

It is well known to provide a SAW device with an apodized IDT, in which the fingers of the IDT overlap along their lengths by differing amounts at different positions along the IDT in a pattern which determines a response function of the IDT. The pattern is typically a so-called (sin x)/x pattern which consists of a main central lobe bounded on each side by successively smaller side lobes, all of the lobes having a common axis. At the centre of the main lobe the fingers overlap along their lengths over substantially the whole width of the IDT, this maximum overlap defining the aperture of the IDT.

An unbalanced IDT has one set of fingers grounded and the other set driven. In order to reduce electromagnetic feedthrough of signals via a SAW device, the SAW device is generally mounted in close proximity to a ground plane. Typically the substrate of the SAW device is mounted directly on a ground plane of a printed circuit board. It has been found that as a result the relatively long driven finger, for which there is only a short overlap in the apodization pattern, at one or both ends of the IDT provides significant coupling to the ground plane, which is exacerbated by the distribution of charge in the fingers of the IDT (the charge being considerably higher at the end fingers than at the fingers in the middle of the IDT) to such an extent as to cause significant ripples in the response of the SAW device.

An object of this invention is to provide apparatus including a SAW device in which this disadvantage is avoided or reduced.

According to this invention there is provided apparatus comprising: a SAW (surface acoustic wave) device comprising a substrate and an IDT (inter-digital transducer) thereon, the IDT comprising two conductive rails and a plurality of inter-digital fingers extending therefrom, the fingers extending from each rail having varying lengths whereby the fingers extending from the two rails overlap to form an apodization pattern, wherein the apodization pattern has a predetermined axis which is closer to one conductive rail of the IDT at each end of the pattern than between the ends of the pattern a signal connection to said one conductive rail of the IDT; and a ground connection to the other conductive rail of the IDT.

The driven finger at each end of the IDT is relatively short, and consequently has a low capacitive coupling to any ground plane, whereby response ripples due to such capacitive coupling are reduced.

Preferably the axis is substantially at the edge of the aperture of the IDT adjacent to said one conductive rail at each end of the pattern.

The SAW device may also include a ground plane and support means supporting the substrate on the ground plane whereby an insulating material is disposed between the ground plane and the substrate beneath the IDT. The apparatus may include a ground plane and support means supporting the substrate on the ground plane whereby an insulating material is disposed between the ground plane and the substrate beneath the IDT. The insulating material reduces the capacitive coupling between the IDT and the ground plane, and thereby reduces response ripples due to such coupling, without any apparent degradation of the electromagnetic feedthrough characteristics of the SAW devices.

Preferably the insulating material comprises an air gap and the support means supports the substrate in at least one area other than beneath the IDT, the support means preferably comprising an insulating material having a low dielectric constant. Alternatively, the insulating material may comprise a material having a low dielectric constant and constituting the support means. In either case the support means is conveniently of silicon dioxide.

Figure 2:
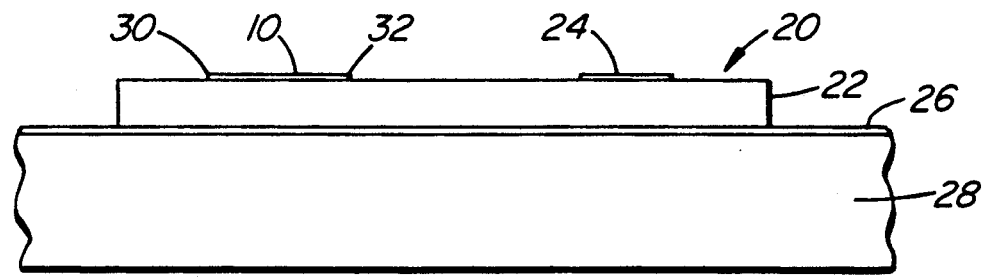
Figure 3:
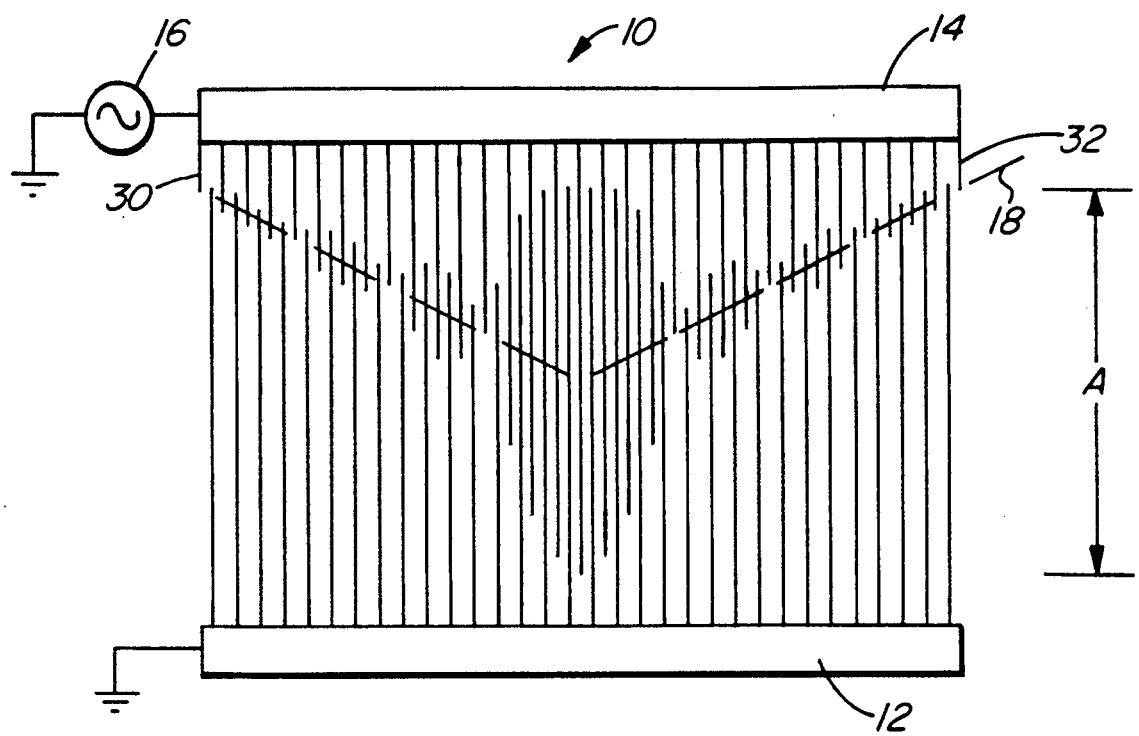
Figure 4:
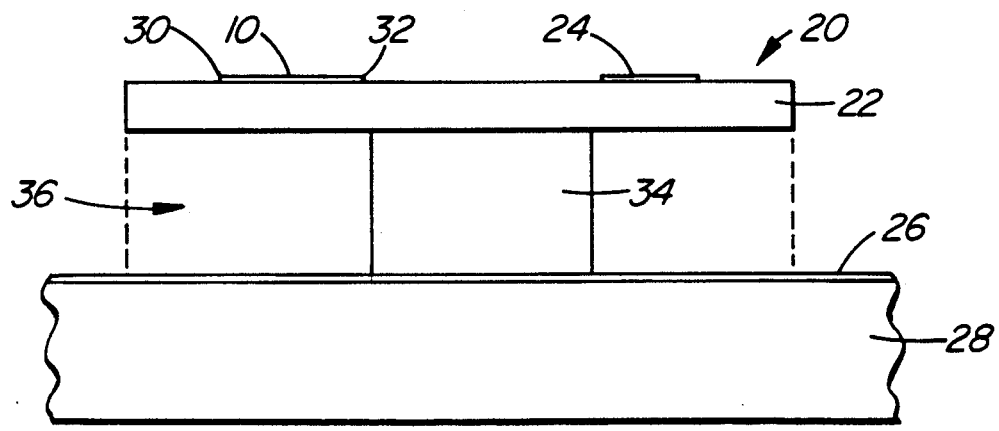

The invention will be further understood from the following description with reference to the accompanying drawings, in which:

FIG. 1 schematically illustrates a known form of inclined axis apodized IDT;

FIG. 2 schematically illustrates a known manner of mounting a SAW device;

FIG. 3 schematically illustrates an apodized IDT of a SAW device in accordance with an embodiment of the invention; and FIG. 4 schematically illustrates a mounting arrangement for a SAW device in accordance with an embodiment of this invention.

Referring to FIG. 1, there is illustrated a known form of inclined axis apodized IDT 10 which comprises two sets of inter-digital fingers which overlap one another along their lengths in a predetermined apodization pattern. One set of fingers is connected to a common conductive rail 12 which is grounded, and the other set of fingers is connected to a common conductive rail 14 which is driven with respect to ground by a signal source 16; the fingers are accordingly referred to as being grounded and driven respectively.

FIG. 1 represents the fingers in a greatly simplified and diagrammatic manner for clarity. As is known in the art, in practice the IDT 10 would include many more fingers than are illustrated, the individual fingers may be bifurcated, and dummy fingers opposite the active fingers illustrated may also be provided. The same comments apply equally to FIG. 3 described below. Furthermore, it is also observed that each IDT may include anti-reflection dummy fingers, and that an acoustic absorber may be provided at the back end of each IDT to eliminate undesired surface acoustic waves, but these also are not illustrated in the drawings for the sake of clarity and simplicity.

In FIG. 1 a broken line 18 represents an axis of the apodization pattern. This axis 18, rather than being parallel to the rails 12 and 14 and hence parallel to the propagation direction of surface acoustic waves transduced by the IDT, is inclined so that over the length of the IDT it extends across the entire aperture A of the IDT 10. The aperture A corresponds to the maximum extent of overlap of the fingers of the IDT. This inclination of the axis 18 serves in known manner to spread discontinuities across the entire width of the IDT, in order in known manner to enhance the characteristics of the IDT.

In use, the IDT 10 serves as part of a SAW device as diagrammatically illustrated in FIG. 2. Referring to FIG. 2, a SAW device 20 comprises a lithium niobate (LiNbO$_3$) substrate 22 on which two IDTs, one of which may be an apodized IDT 10 as illustrated in FIG.

1 and the other of which may be an unapodized IDT 24, are formed for propagation of surface acoustic waves therebetween. The substrate 22 is mounted on a ground plane 26 which in FIG. 2 is illustrated as being on an upper surface of a printed circuit board 28. The board 28 may also include another ground plane (not shown) on its lower surface, with connections through the board between the ground planes. The proximity of the IDTs 10 and 24 to the ground plane 26 helps to reduce electromagnetic feedthrough between the IDTs.

The driven fingers connected to the rail 14 of the IDT have a charge distribution, due to the electric fields between these driven fingers and (i) the ground plane 26 and (ii) the adjacent grounded fingers, which is such that the charge carried by the end fingers 30 and 32 is much higher than that carried by the fingers in the middle of the IDT, the charge of successive driven fingers falling rapidly with increasing distance from these end fingers 30 and 32 and being substantially constant over most of the length of the IDT. The finger 30 is short, so that it has a relatively small capacitive coupling to the ground plane 26 and the relatively high charge of this finger (and, to a lesser extent, of the immediately adjacent fingers connected to the rail 14) has substantially no adverse effect. The finger 32, however, extends across most of the aperture A, and hence has a considerable capacitive coupling to the ground plane 26, this capacitive coupling being enhanced by the high dielectric constant which is desirable for the substrate 22 for optimal performance of the SAW device.

In consequence, the relatively high charge of the end finger 32 (and, to a lesser extent, of the immediately adjacent fingers connected to the rail 14) is coupled substantially to the ground plane 26 as a result of the capacitance therebetween, thereby producing significant ripples in the response of the SAW device 20. Due to the small overlap of the finger 32 with the adjacent grounded finger coupled to the rail 12, the adverse coupling to the ground plane 26 is greater than the desired contribution of the finger 32 to the response of the SAW device.

Whilst the above comments relate to an IDT 10 with an inclined apodization axis, they apply equally to the driven fingers at both ends of an IDT with an apodization axis which is normal to the fingers.

FIGS. 3 and 4, in which the same references as in FIGS. 1 and 2 are used to denote similar components, schematically illustrate embodiments of the invention in which the undesired coupling is reduced or eliminated.

Referring to FIG. 3, the apodization pattern of the IDT 10 is modified in accordance with an embodiment of the invention in that the apodization axis 18 is no longer straight but instead has a V shape. Thus in FIG. 3 the apodization axis 18 extends from points at each end of the IDT at the edge of the aperture A adjacent to the driven rail 14 to a point half way across the aperture A at the centre of the IDT.

As a result, the driven fingers 30 and 32 at the ends of the IDT are equally short, and have a negligible capacitive coupling to the ground plane, whereby the above-mentioned ripples in the SAW device response are substantially avoided.

Although in FIG. 3 the apodization axis 18 is illustrated as being of a straight V shape, with the axis crossing the edge of the aperture A at the ends of the IDT, it could instead be curved or otherwise shaped and could be further from the rail 14 at the ends of the IDT.

In addition to the shaping of the apodization axis 18 as described above the SAW device 20 may be mounted as illustrated in FIG. 4. As shown in FIG. 4, instead of being mounted directly onto the ground plane 26 the substrate 22 is supported thereon by a spacer 34 so that there is an air gap 36 between the ground plane 26 and the substrate 22 below the IDT 10. For example, this air gap 36 may be three times as high as the substrate 22, and has a dielectric constant of 1 compared to for example 35 for a 128° rotated Y-cut lithium niobate substrate, whereby the capacitance between the finger 32 and the ground plane 26 is reduced by a factor of about 100, corresponding to a 40 dB reduction of the undesired SAW device response ripples. For example the height or thickness of the substrate 22 and the air gap 36 may be respectively 0.02 inch (0.5 mm) and 0.06 inch (1.5 mm).

The spacer 34 is desirably of an insulating material having a low dielectric constant, for example of silicon dioxide ($SiO_2$) having a dielectric constant of about 3. In this case the support 34 may be extended to occupy all of the region below the substrate 22 as shown by broken lines in FIG. 4, with a corresponding increase in height of this support or decrease in capacitance reduction due to the increased dielectric constant below the IDT 10.

It has been found empirically that the spacing of the substrate 22 from the ground plane 26 as illustrated in FIG. 4 does not detract significantly from the electromagnetic feedthrough characteristics of the SAW device.

Although particular embodiments of the invention have been described in detail above, it should be appreciated that numerous modifications, variations, and adaptations may be made thereto without departing from the scope of the invention as defined in the claims.

What is claimed is:

1. Apparatus comprising:
   a SAW (surface acoustic wave) device comprising a substrate and an IDT (inter-digital transducer) thereon, the IDT comprising two conductive rails and a plurality of inter-digital fingers extending therefrom, the fingers extending from each rail having varying lengths whereby the fingers extending from the two rails overlap to form an apodization pattern, wherein the apodization pattern has a predetermined axis which is closer to one conductive rail of the IDT at each end of the pattern than between the ends of the pattern;
   a signal connection to said one conductive rail of the IDT; and
   a ground connection to the other conductive rail of the IDT.

2. Apparatus as claimed in claim 1 wherein the axis is substantially at the edge of the aperture of the IDT adjacent to said one conductive rail at each end of the pattern.

3. Apparatus as claimed in claim 2 wherein the axis has a substantially straight V shape.

4. Apparatus as claimed in claim 1 wherein the axis passes through a point substantially at the center of the aperture of the IDT.

5. Apparatus as claimed in claim 2 wherein the axis passes through a point substantially at the center of the aperture of the IDT.

6. Apparatus as claimed in claim 3 wherein the axis passes through a point substantially at the center of the aperture of the IDT.

7. Apparatus as claimed in claim 1 and including a ground plane and support means supporting the substrate on the ground plane whereby an insulating material is disposed between the ground plane and the substrate beneath the IDT.

8. Apparatus as claimed in claim 7 wherein the insulating material comprises an air gap and the support means supports the substrate in at least one area other than beneath the IDT.

9. Apparatus as claimed in claim 8 wherein the support means comprises an insulating material having a low dielectric constant.

10. Apparatus as claimed in claim 7 wherein the insulating material comprises a material having a low dielectric constant and constitutes the support means.

11. Apparatus as claimed in claim 7 wherein the support means comprises silicon dioxide.

* * * * *